United States Patent
Yoon

(10) Patent No.: US 6,490,208 B2
(45) Date of Patent: Dec. 3, 2002

(54) COLUMN REDUNDANCY CIRCUIT

(75) Inventor: Ha Ryong Yoon, Seoul (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 09/892,517

(22) Filed: Jun. 28, 2001

(65) Prior Publication Data

US 2002/0001896 A1 Jan. 3, 2002

(30) Foreign Application Priority Data

Jun. 29, 2000 (KR) .......................................... 00-36597

(51) Int. Cl.[7] .............................................. G11C 7/00
(52) U.S. Cl. .................................. 365/200; 365/230.06
(58) Field of Search .......................... 365/200, 230.06, 365/231, 230.02, 189.02, 196

(56) References Cited

U.S. PATENT DOCUMENTS

| | | | | |
|---|---|---|---|---|
| 6,067,260 A | * | 5/2000 | Ooishi et al. | 365/200 |
| 6,144,591 A | * | 11/2000 | Vlasenko et al. | 365/200 |
| 6,172,916 B1 | * | 1/2001 | Ooishi et al. | 365/189.02 |
| 6,314,030 B1 | * | 11/2001 | Keeth | 365/200 |
| 2001/0026496 A1 | * | 10/2001 | Hidaka | 365/230.03 |

* cited by examiner

Primary Examiner—David Nelms
Assistant Examiner—Thong Le
(74) Attorney, Agent, or Firm—Pillsbury Winthrop LLP

(57) ABSTRACT

A column redundancy circuit for a semiconductor memory device, includes a plurality of DQ region units each including a memory cell array unit having cells sharing a local data bus and a global data bus, a column decoder unit for generating a column decoding signal for selecting one of the cells, a write driver unit for driving input data to the global data bus, and a read sense amp unit for amplifying input data, and transmitting the data to a global I/O line; and a repair region unit being provided at one side of the DQ regions, and consisting of a repair cell array unit having repair cells sharing the local data bus and the global data bus, N column decoder units for generating a column decoding signal for selecting one of the repair cells, N write driver units for driving input data to the repair global data bus, N read sense amp units for amplifying input data, and transmitting the data to the global I/O line, N DQ selection fuse box units for programming information of the DQ region unit having a defect cell, and N multiplexer and demultiplexer units for switching one write driver unit, one read sense amp unit, and the global I/O line according to output signals from the DQ selection fuse box units.

2 Claims, 3 Drawing Sheets

COLUMN REDUNDANCY CIRCUIT

BACKGROUND OF THE INVENTION

1. Field of the Invention

The present invention relates in general to a column redundancy circuit for a semiconductor memory device, and more particularly to an improved column redundancy circuit which can improve repair flexibility and efficiency without increasing column redundancy. It does so by providing information of a DQ having a defect to a column redundancy fuse box in order to repair a defect of another DQ.

2. General Background and Related Art

In general, when a cell in a cell array has a defect, a column redundancy circuit replaces a bit line connected to the cell by a spare bit line, thereby compensating for the defect. When an address of selecting the defect cell is internally applied to a device, a normal path of selecting the defect cell is intercepted, and a redundancy circuit is operated, thereby enabling the bit line connected to the repaired cell. Accordingly, the column redundancy operation is performed.

FIG. 1 (Prior Art) is a schematic diagram illustrating a conventional column redundancy circuit for a DRAM. The conventional column redundancy circuit includes DQ regions DQ0~DQn that are physically divided to access data, and have a plurality of normal cells 2 and a plurality of repair cells 3. A column decoder unit 4, 14 selects the normal cell 2, 12 of the respective DQ regions DQ0~DQn. A repair column decoder unit 5, 15 selects the repair cell 3, 13 of the respective DQ regions DQ0~DQn. A write driver and read sense amp unit 6, 16 having a write driver for driving data inputted through a global I/O line GIO<n> to a memory cell in a write operation, and a read sense amp for sensing and amplifying the data from the memory cell, and outputting the data to the global I/O line GIO<n> in a read operation.

When the DQ regions DQ0~DQn are physically divided from cell regions 1, 11, a local data bus LCD and a global data bus GDB share each other in their DQ, and thus the repair column cells 3, 13 can repair a defect cell only in the DQ which they belong to.

Accordingly, the number of the repair cells must be increased to improve repair flexibility and efficiency of the conventional column redundancy circuit. However, in this case, a size of a chip is increased, which results in high production cost and low productivity.

SUMMARY

The claimed inventions feature, at least in part, a column redundancy circuit which can improve repair flexibility and efficiency without increasing column redundancy, by providing information of a DQ having a defect to a column redundancy fuse box so as to repair a defect of another DQ.

There is provided a column redundancy circuit including a plurality of DQ region units including a memory cell array unit having a plurality of cells sharing a local data bus and a global data bus. A column decoder unit generates a column decoding signal for selecting one of the cells. A write driver unit drives data inputted through a global I/O line to the global data bus. A read sense amp unit amplifies data inputted through the global data bus, and transmits the data to the global I/O line. A repair region unit including a repair cell array unit has a plurality of repair cells sharing the local data bus and the global data bus. N column decoder units generate a column decoding signal for selecting one of the repair cells. N write driver units drive data inputted through the global I/O line to the repair global data bus. N read sense amp units amplify data inputted through the repair global data bus, and transmit the data to the global I/O line. N DQ selection fuse box units program information of the DQ region unit having a defect cell among the plurality of DQ region units. N multiplexer and demultiplexer units switch one write driver unit among the N write driver units, one read sense amp unit among the N read sense amp units, and the global I/O line according to output signals from the DQ selection fuse box units.

The column redundancy circuit further includes N decoder units for decoding the output signals from the N DQ selection fuse box units, and outputting the decoded signals to the N multiplexer and demultiplexer units.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION

Figure 1:
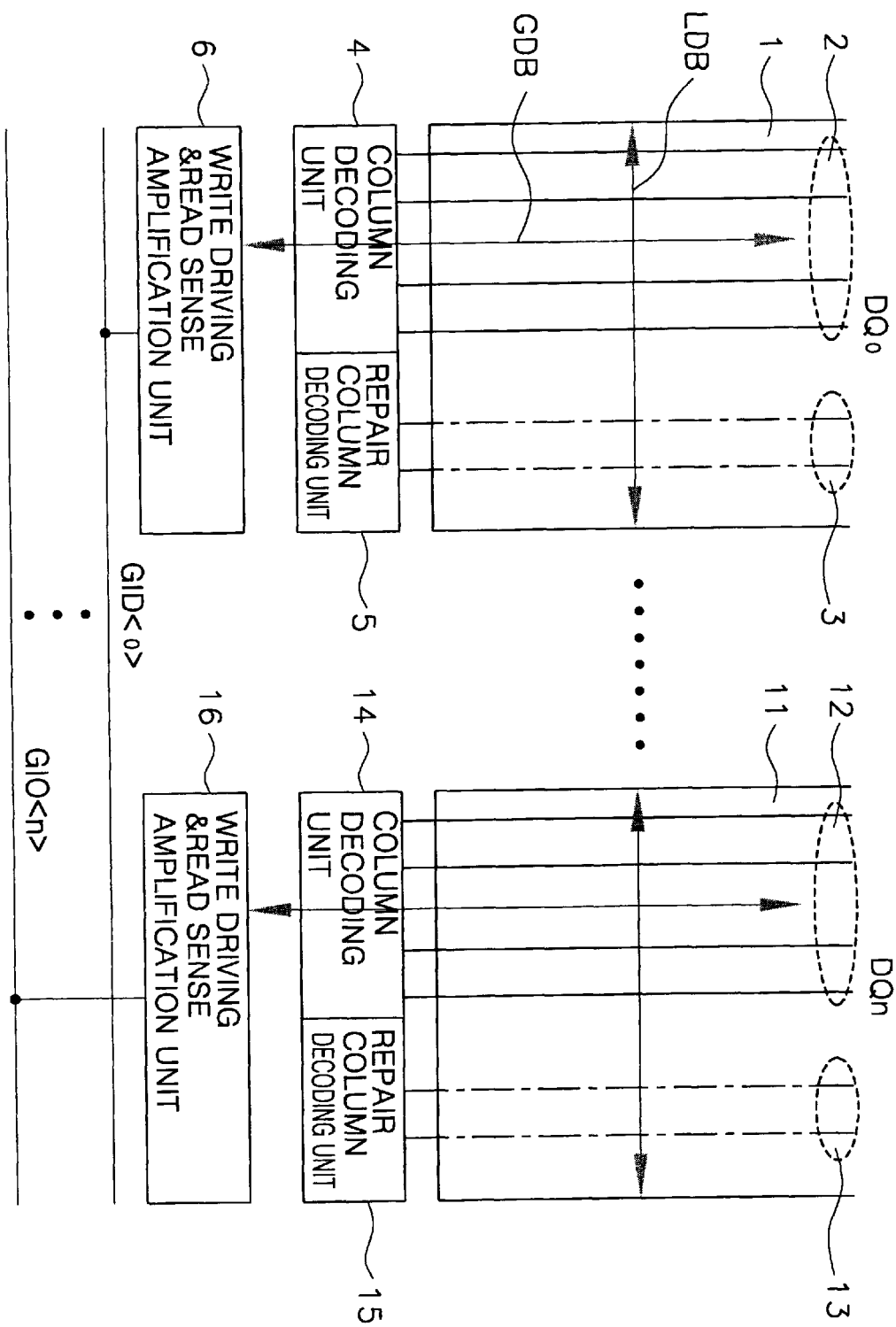
FIG. 1 (Prior Art) is a schematic diagram illustrating a conventional column redundancy circuit for a DRAM.

A column redundancy circuit in accordance with the present invention will now be described in detail with reference to the accompanying drawings Elements having an identical function are provided with the identical reference numeral, and repeated explanations thereof will be omitted.

Figure 2:
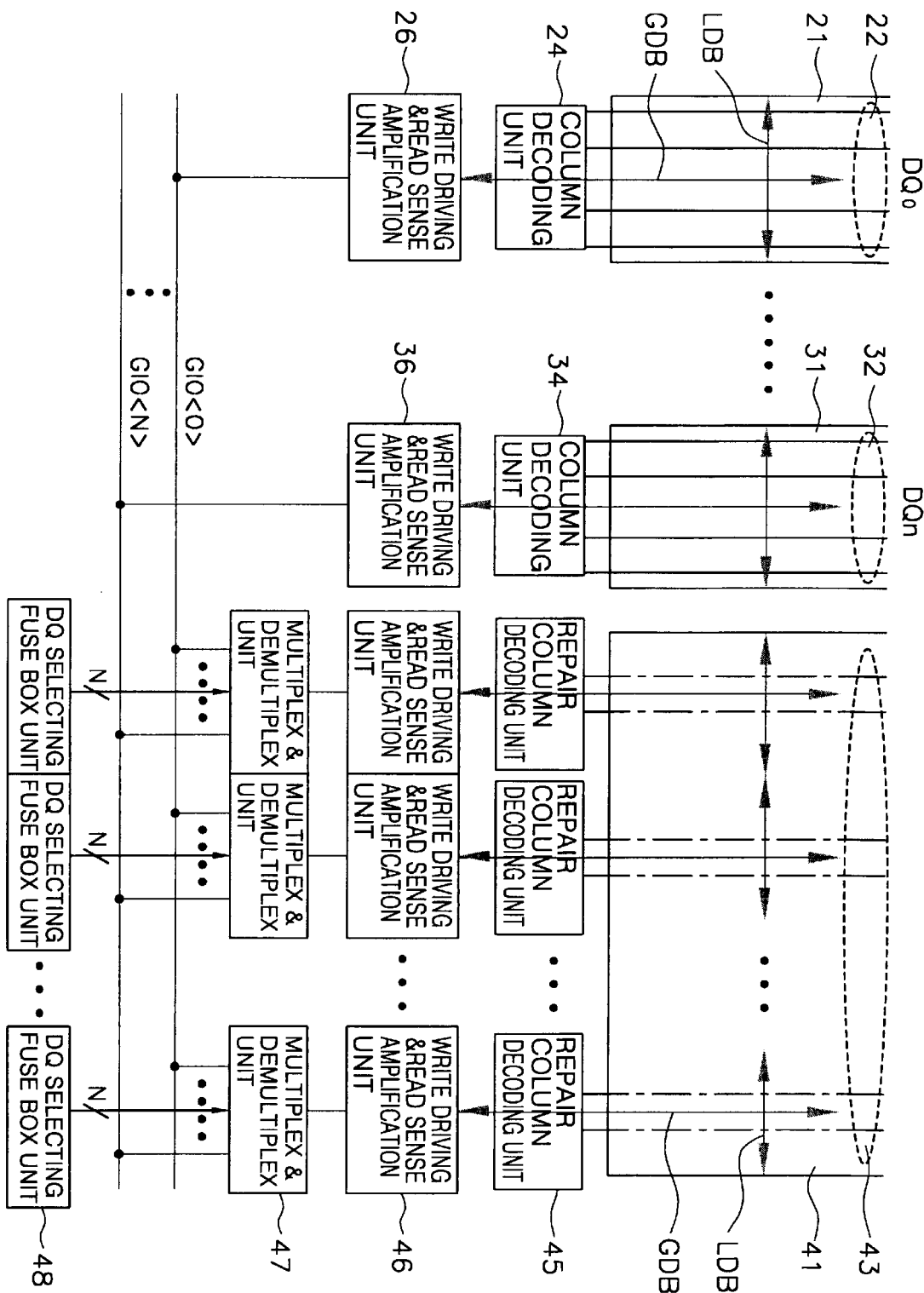
FIG. 2 is a schematic diagram illustrating a column redundancy circuit in accordance with a first embodiment of the present invention.

FIG. 2 is a schematic diagram of a column redundancy circuit in accordance with a first embodiment of the present invention. The column redundancy circuit includes DQ regions DQ0~DQn that are physically divided to access data, and have a local data bus LDB and a global data bus GDB for selecting a plurality of normal cells 22, 32. Column decoder units 24, 34 select the normal cells 22, 32 of the respective DQ regions DQ0~DQn. A write driver and read sense amp unit 26 includes a write driver for driving data inputted through global I/O lines GIO<0>, GIO<n>to the normal cells 22, 32 in a write operation, and a read sense amp for sensing and amplifying the data from the normal cell 22, and outputting the data to the global I/O line GIO<n> in a read operation.

A repair cell region unit 41 includes a plurality of repair cells 43 for replacing the normal cells 22, 32 having a defect, and share the local data bus LDB and the global data bus GDB for selecting the repair cell 43. This region is included in one region of the DQ regions DQ0~DQn.

In addition, the column redundancy circuit includes a repair column decoder unit 45 for driving a repair column selection line of the repair cell region unit 41. A write driver and read sense amp unit 46 including a write driver drives data inputted through the global I/O lines GIO<0>, GIO<n>to the repair cell 43 in a write operation, and a read sense amp senses and amplifies data from the repair cell 43, and outputs the data to the global I/O lines GIO<0>, GIO<n>. A DQ selection fuse box unit 48 connects the write driver and read sense amp unit 46 to the corresponding I/O line, by intercepting a fuse of the DQ region having a defect. A multiplexer and demultiplexer unit 47 including a multiplexer connects the write driver to the corresponding I/O line according to the output signal from the DQ selection fuse box unit 48. A demultiplexer connects the read sense amp to the corresponding I/O line according to the output signal from the DQ selection fuse box unit 48.

The operation of the column redundancy circuit in accordance with the present invention will now be explained, presuming that the DQ0 region 21 has a defect. When the DQn 31 has a defect, the operation is the same as that of the DQ0 21. So the explanation about the DQn 31 will be omitted here. Before the repair operation, the fuse box of the DQ selection fuse box unit 48 is not aligned to the DQ regions DQ0–DQn.

When the DQ0 region 21 has a defect, the DQ selection fuse box unit 48 intercepts a fuse corresponding to the DQ0 region 21. The output signal from the DQ selection fuse box unit 48 is inputted to the multiplexer and demultiplexer unit 47 of the corresponding repair column cell. The multiplexer of the multiplexer and demultiplexer unit 47 connects the write driver of the write driver and read sense amp unit 46 to the corresponding global I/O line GIO according to the output signal from the DQ selection fuse box unit 48. The demultiplexer of the multiplexer and demultiplexer unit 47 connects the read sense amp to the corresponding I/O line according to the output signal from the DQ selection fuse box unit 48.

Therefore, the data from the repair cell is outputted merely through the global I/O line GIO which is an I/O line of the DQ0 region. In the same manner, the fuse box may be aligned to any of the DQ regions having a defect.

Figure 3:
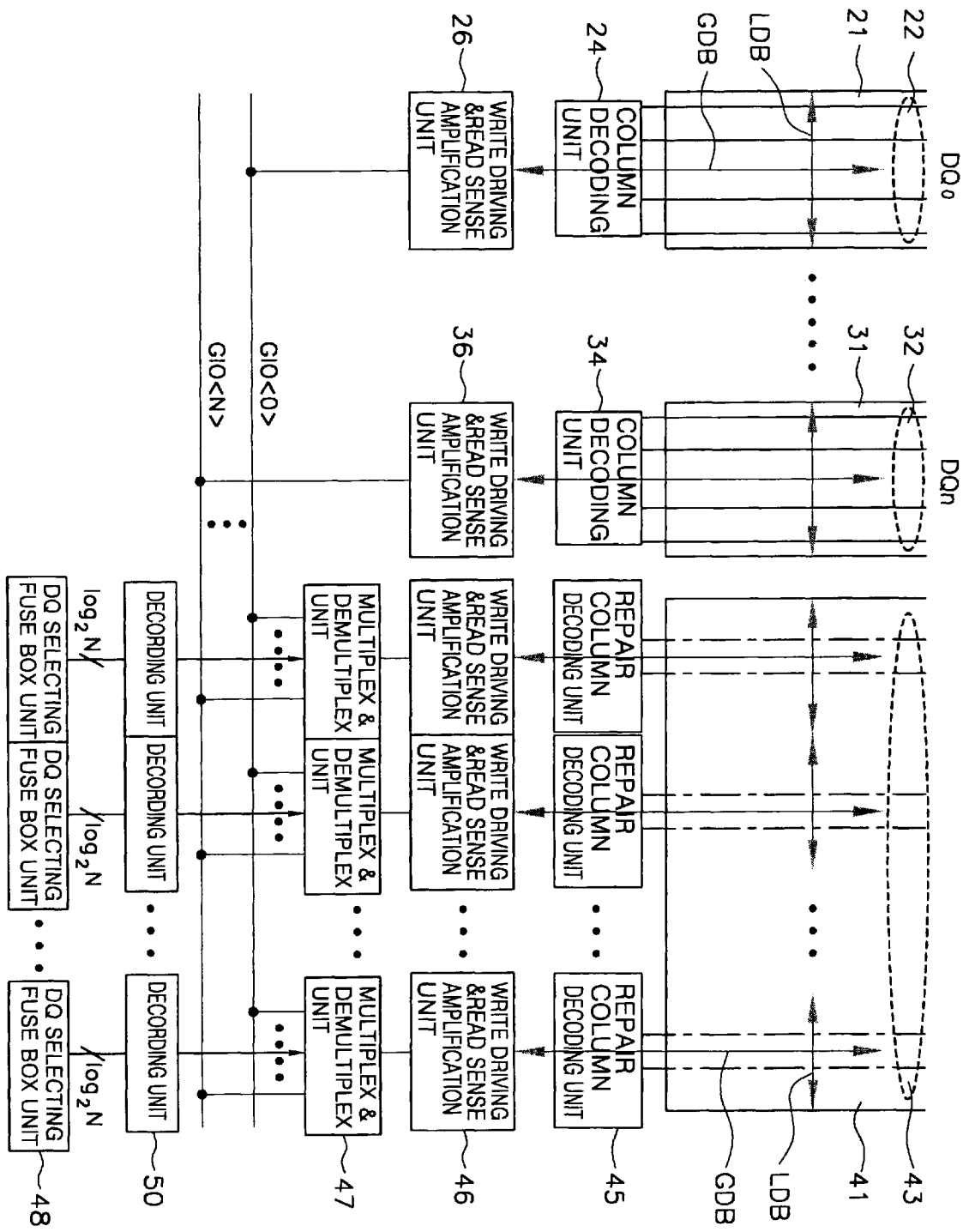
FIG. 3 is a schematic diagram illustrating a column redundancy circuit in accordance with a second embodiment of the present invention.

FIG. 3 is a schematic diagram showing a column redundancy circuit in accordance with a second embodiment of the present invention. The column redundancy circuit further includes a decoder unit 50 in order to reduce the number of the signal lines from the DQ selection fuse box unit 48 to the multiplexer and demultiplexer unit 47.

The column redundancy circuit provides information of the DQ having a defect to the column redundancy fuse box, thereby repairing a defect of another DQ.

As discussed earlier, the column redundancy circuit in accordance with the present invention can improve repair flexibility and efficiency without increasing column redundancy, by providing the information of the defect DQ to the column redundancy fuse box in order to repair the defect of another DQ.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A column redundancy circuit for a semiconductor memory device, comprising:

a plurality of DQ region units including a memory cell array unit having a plurality of cells arranged in cell banks and sharing a local data bus and a global data bus, a column decoder unit for generating a column decoding signal for selecting one of the cells, a write driver unit for driving data input through a global I/O line to the global data bus, and a read sense amp unit for amplifying data inputted through the global data bus, and transmitting the data to the global I/O line; and a repair region unit provided at one side of the DQ region units capable of substituting for regular cells regions of any memory cell bank, and including a repair cell array unit having a plurality of repair cells sharing the local data bus and the global data bus, N (an integer) column decoder units for generating a column decoding signal for selecting one of the repair cells, N write driver units for driving data input through the global I/O line to a repair global data bus, N read sense amp units for amplifying data inputted through the repair global data bus, and transmitting the data to the global I/O line, N DQ selection fuse box units for programming information of the DQ region unit having a defect cell among the plurality of DQ region units, and N multiplexer and demultiplexer units for switching one write driver unit among the N write driver units, one read sense amp unit among the N read sense amp units, and the global I/O line according to output signals from the DQ selection fuse box units.

2. The column redundancy circuit according to claim 1, further comprising N decoder units for decoding the output signals from the N DQ selection fuse box units, and outputting the decoded signals to the N multiplexer and demultiplexer units.

* * * * *